(12) United States Patent
Oh et al.

(10) Patent No.: US 9,153,572 B1
(45) Date of Patent: Oct. 6, 2015

(54) INTEGRATED CIRCUIT SYSTEM WITH DYNAMIC DECOUPLING AND METHOD OF MANUFACTURE THEREOF

(71) Applicant: Altera Corporation, San Jose, CA (US)

(72) Inventors: Kyung Suk Oh, Cupertino, CA (US); Sergey Yuryevich Shumarayev, Los Altos Hills, CA (US); Hae-Chang Lee, Los Altos, CA (US); Boon Jin Ang, Butterworth (MY); Guang Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/489,326

(22) Filed: Sep. 17, 2014

(51) Int. Cl.
*H03K 17/16* (2006.01)
*H01L 27/02* (2006.01)
*H03K 19/00* (2006.01)
*H03K 19/003* (2006.01)
*H03K 17/081* (2006.01)

(52) U.S. Cl.
CPC ...... *H01L 27/0288* (2013.01); *H03K 17/08104* (2013.01); *H03K 19/0013* (2013.01); *H03K 19/00384* (2013.01)

(58) Field of Classification Search
CPC .................. H03K 19/0013; H03K 19/00384
USPC ............................................... 326/21, 26, 34
See application file for complete search history.

(56) References Cited

U.S. PATENT DOCUMENTS

| | | | |
|---|---|---|---|
| 7,309,912 B1 | 12/2007 | Shi et al. | |
| 7,412,668 B1 | 8/2008 | Duong | |
| 8,410,579 B2 | 4/2013 | Ghia et al. | |
| 8,504,976 B2 | 8/2013 | Liu et al. | |
| 8,627,261 B1 | 1/2014 | Oishei et al. | |
| 2004/0124510 A1* | 7/2004 | Piorun et al. | 257/678 |
| 2009/0091378 A1* | 4/2009 | Haridass et al. | 327/554 |
| 2012/0228760 A1* | 9/2012 | Lim et al. | 257/737 |
| 2013/0062733 A1* | 3/2013 | Summerfelt et al. | 257/532 |
| 2013/0285739 A1* | 10/2013 | Blaquiere et al. | 327/565 |

OTHER PUBLICATIONS

Analog Devices, "Decoupling Techniques", "MT-101 Tutorial", Mar. 2009, pp. 1-14, Analog Devices; http://www.analog.com/static/imported-files/tutorials/MT-101.pdf.

* cited by examiner

*Primary Examiner* — Don Le
(74) *Attorney, Agent, or Firm* — Ishimaru & Associates LLP (57) ABSTRACT

A system and a method of manufacture of an integrated circuit system includes: a supply grid connected to an active component of an integrated circuit die; a high voltage capacitor connected to the supply grid; a low voltage decoupling capacitor connected to the supply grid; a pass gate gating the low voltage decoupling capacitor; and a pass gate control for controlling the pass gate to cause the high voltage capacitor and the low voltage decoupling capacitor to stabilize voltage of the supply grid during activity of the active component.

20 Claims, 6 Drawing Sheets

INTEGRATED CIRCUIT SYSTEM WITH DYNAMIC DECOUPLING AND METHOD OF MANUFACTURE THEREOF

TECHNICAL FIELD

The present invention relates generally to an integrated circuits system, and more particularly to an integrated circuit system with dynamic decoupling.

BACKGROUND ART

An integrated circuit (IC) system, which includes structured application specific integrated circuits (ASICs) and field programmable gate arrays (FPGAs), are used to implement large systems that may include millions of gates and megabits of embedded memory. Switching activities of components in the integrated circuit system put stress on power distribution networks (PDNs) supporting it. The changing states of logic and memory elements require the integrated circuit power distribution networks to supply more power than if the logic and memory elements were operating in a constant state. When a large number of logic and memory elements change states simultaneously, a large demand is placed on the power distribution networks (PDNs). Excessive voltage swings by the integrated circuit system can lead to faulty operation thereof.

To avoid unacceptable voltage deviations, the power distribution networks (PDNs) should be properly decoupled over switching frequencies of the integrated circuit system. Decoupling capacitors typically operate to decouple the PDNs over a range of switching frequencies. These decoupling capacitors store electric charges. When extra current is required from the PDNs, the decoupling capacitors can be discharged to meet the demands to stabilize the PDNs.

When the integrated circuit system supports multiple-voltage power distribution networks (PDNs), the decoupling capacitors need to meet requirements of different voltages of the PDNs.

Thus, a need still remains for an integrated circuit system having dynamic decoupling. In view of growing demands for supporting multiple signaling schemes, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

Embodiments of the present invention provide a method of manufacture of an integrated circuit system including: providing a supply grid connected to an active component of an integrated circuit die; connecting a high voltage capacitor to the supply grid; connecting a low voltage decoupling capacitor to the supply grid; gating the low voltage decoupling capacitor with a pass gate; and configuring a pass gate control for controlling the pass gate to cause the high voltage capacitor and the low voltage decoupling capacitor to stabilize voltage of the supply grid during activity of the active component.

Embodiments of the present invention provide an integrated circuit system, including: a supply grid connected to an active component of an integrated circuit die; a high voltage capacitor connected to the supply grid; a low voltage decoupling capacitor connected to the supply grid; a pass gate gating the low voltage decoupling capacitor; and a pass gate control for controlling the pass gate to cause the high voltage capacitor and the low voltage decoupling capacitor to stabilize voltage of the supply grid during activity of the active component.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

An integrated circuit system, such as structured application specific integrated circuits (ASICs) or field programmable gate arrays (FPGAs), can include an integrated circuit die, an interposer, and a package substrate. Supply girds, such as ground grids or power grids, are provided on the integrated circuit die. To overcome excessive voltage swings of the supply grids caused by switching activities of active components of the integrated circuit system, decoupling capacitors are implemented to stabilize the supply grids. The decoupling capacitors, such as Thick Oxide capacitors, Metal-Insulator-Metal (MIM) capacitors, High Density Metal-Insulator-Metal (HDMIM), Metal Finger Capacitor (MFC), or stackable Metal-Insulator-Metal (MIM) capacitors, can be integrated on-die, on-interposer, on-package, or on-board.

General purpose input/output (I/O) pads of the integrated circuit system often support different signaling schemes and multiple power levels. Currently known signaling schemes typically require on-die decoupling capacitors which meet the highest voltage requirement of the multiple power levels of the active components on an integrated circuit die. The term "high voltage" refers to the highest voltage applied an integrated circuit die and varies from integrated circuit die to integrated circuit die. The term "low voltage" refers to any voltage lower than the "high voltage" or highest voltage applied and includes multiple lower voltages which may be applied to the integrated circuit die.

The term "high voltage capacitor" refers to a capacitor capable of handling the high voltage of an integrated circuit chip and the high voltage capacitor is designed according to the highest voltage of a particular integrated circuit die. The term "low voltage" as used to describe other capacitors refers to capacitors for handling voltages lower than the highest voltage of the particular integrated circuit die.

Thus, the actual voltage of a high voltage capacitor is a variable dependent on the highest voltage applied to the integrated circuit die and is a result-effective variable; i.e., a variable which achieves the dynamic decoupling of various embodiments of the present invention. Similarly, the actual voltage of a low voltage decoupling capacitor is a variable dependent on the lower voltage or voltages applied to the integrated circuit die and is also a result-effective variable for various embodiments of the present invention.

Various different capacitors can be used in different embodiments of the present invention because of different advantages. For example, Thick Oxide capacitors usually cause approximately 40% capacitance density reduction, thicker metal-insulator-metal (MIM) capacitors can have about 50% reduction in capacitance density, and stack low voltage metal-insulator-metal (MIM) capacitors can reduce capacitance density up to 75%.

A recent signaling scheme often requires a greater decoupling capacitance and a higher data rate for a better circuit performance compared with a legacy signaling scheme supporting a higher voltage level at lower frequency. But to reduce power consumption, the recent signaling scheme uses a lower voltage. The legacy signaling scheme does not require as high performance as new signaling scheme, may work with less decoupling capacitance, and uses a higher voltage at a lower frequency.

Since the high voltage capacitor has less capacitance per die area, as discussed in the MIM capacitor above, it has been unexpectedly found that utilizing high voltage capacitors at low voltage can result in significant reduction in the total capacitance, given the same die area, and may impact integrated circuit performance.

Thus, it has been discovered that the integrated circuit system and the method of manufacturing embodiments of the present invention furnish important and heretofore unknown and unavailable solutions, capabilities, and functional aspects for low voltage dynamic decoupling capacitors at low voltage.

The integrated circuit system can support multiple signaling schemes at multiple power levels. Each of the signaling schemes and power levels can have an individual group of decoupling capacitors to meet an individual decoupling requirement. Dynamical switching among different groups of decoupling capacitors can meet the individual decoupling requirement of the PDNs, minimize the cost of manufacturing, and achieve the best circuit performance.

When the integrated circuit system supports high voltage signaling schemes, only the high voltage capacitors are used for decoupling. The low voltage decoupling capacitors can turned off since they do not tolerant the high voltages. The availability of large spaces for the high voltage capacitors may be low, and resulting in a low capacitance density.

When the integrated circuit system supports low voltage signaling schemes, more decoupling capacitors are needed to meet high frequency circuit performance demand than the high voltage signaling schemes. The low voltage decoupling capacitance can be combined with the high voltage capacitors for decoupling. The low voltage decoupling capacitors can have capacitor metal plates to be closer than the high voltage capacitors since they are not necessary to tolerate the high voltages. The higher capacitance is obtained by putting the capacitor plates closer together, reducing the area requirement of the implementation.

Control signals control switching among groups of the decoupling capacitors dynamically in accordance with the signaling schemes, by turning on and off pass gates gating the low voltage decoupling capacitors. The pass gates can include n-channel metal-oxide-semiconductor field-effect transistors (MOSFETs) or NMOS transistors, or p-channel metal-oxide-semiconductor field-effect transistor (MOSFETs) or PMOS transistors, other types of circuit, or combination thereof. Since the low voltage capacitors cannot tolerate high voltages, the low voltage decoupling capacitors are gated and turned off in the high voltage signaling schemes, but turned on in the low voltage signaling schemes. Both the low voltage decoupling capacitors and high voltage capacitors are utilized to support high frequency circuit performance in low voltage signaling schemes.

Some of the integrated circuit systems add on-package decoupling capacitors to increase capacitance when there are limitations on having on-die decoupling capacitors. However, the on-package decoupling capacitors can have potential increase in package layer count to connect to die with reasonable small hook-up inductance in order to provide high frequency current from decoupling capacitor. The increase in package layer count increases the cost of manufacturing.

The integrated circuit system of an embodiment of the present invention is provided with dynamic decoupling capacitors that can provide substantially instant power to stabilize power distribution networks (PDNs) associated with the integrated circuit system. A fabrication method for such an integrated circuit system is also provided. According to various embodiments, the decoupling capacitors, such as the high voltage capacitors and low voltage decoupling capacitors, are connected to supply grid including power grids or ground grids of the integrated circuit system.

The pass gates controlled by the pass gate control signals can shield the low voltage decoupling capacitors from the high voltage power distribution networks (PDNs) of the integrated circuit system. The pass gate control signals can be configured and driven by logic registers or memory bits, such as SDRAM bits. The pass gate control signals can turn on and off the pass gates dynamically in accordance with the signaling schemes. When excessive electric current is demanded from the power distribution networks (PDNs), the decoupling capacitors can be discharged to meet the demand to avoid deviation of the supply grids.

The decoupling capacitors typically store energy when charged and can be recharged as needed in combination with other power sources, such as system power supplies and other decoupling capacitors. When integrated in the integrated circuit system, the decoupling capacitors can effectively provide near instantaneous power to the die and the components thereof to minimize power or ground deviation and supply sufficient amounts of capacitance. After discharging, the decoupling capacitors can be recharged by through package power rails connected to a voltage regulator module (VRM) on a printed circuit board (PCB).

For example, an integrated circuit system, such as a field-programmable gate array (FPGA), has general purpose input/output (I/O) pads that can support various signaling schemes, such as double data rate (DDR) synchronous dynamic random-access memory (SDRAM) interfaces. The DDR SDRAM interfaces can include a double pumping data bus DDR SDRAM (DDR2 SDRAM), double data rate type three synchronous dynamic random access memory (DDR3 SDRAM), and double data rate fourth generation synchronous dynamic random-access memory (DDR4 SDRAM) interfaces. The DDR2 SDRAM typically operates at a high voltage of 1.8V and a low frequency of about 400 MHz. The DDR3 SDRAM typically operates at a lower voltage of 1.5 V and a higher frequency of around 800 MHz, while the DDR4 SDRAM can operate at a lower voltage of 1.2 V and an approximately 1.6 GHz frequency.

The decoupling capacitors of the integrated circuit system are dynamically selected according to the signaling schemes. When the FPGA general purpose I/O pads need to support multiple signaling schemes at multiple voltages, the integrated circuit system can activate or deactivate certain groups of the decoupling capacitors for an optimized decoupling.

Figure 1:
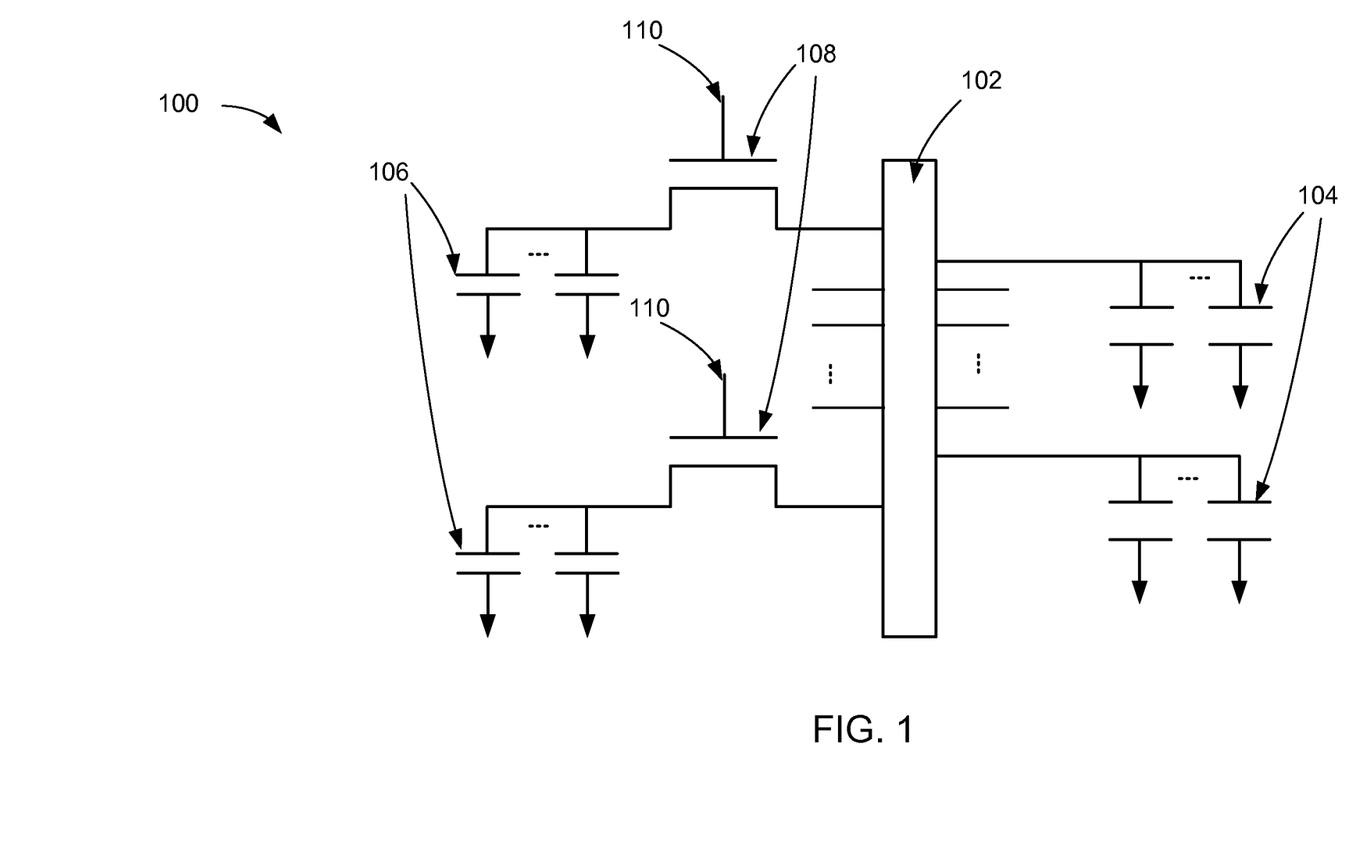
FIG. 1 is a schematic of low voltage decoupling capacitors of an integrated circuit system in an embodiment of the present invention.

Referring now to FIG. 1, therein is shown a schematic of low voltage decoupling capacitors of an integrated circuit system 100 in an embodiment of the present invention. The integrated circuit system 100 can include a supply grid including a power grid 102, high voltage capacitors 104, low voltage decoupling capacitors 106, pass gates 108, and a pass gate control including a low voltage control 110.

A plurality of the high voltage capacitors 104 are shunted and connected to the power grid 102. The gates of the pass gates 108 are connected together to the low voltage control 110. The sources of the pass gates 108 are connected to the power grid 102. A plurality of the low voltage decoupling capacitors 106 integrated on a die of the integrated circuit system 100 are shunted and electrically connected between the drains of the pass gates 108 and grounds.

The power grid 102 of a power distribution network (PDN) of the integrated circuit system 100 can support multiple voltages. The high voltage capacitors 104 are designed to meet the decoupling requirement of the highest voltage that the PDN supports. The low voltage capacitors 106 are designed to meet the decoupling requirement of the low voltage which is lower than the highest voltage.

When the integrated circuit system 100 supports the signaling scheme of the highest voltage, the high voltage capacitors 104 can supply additional power to stabilize the power grid 102. The low voltage control 110 can be configured to turn off the pass gate 108 in high voltage signaling scheme. The pass gates 108 are turned off to shield the low voltage capacitors 106 from the high voltage power distribution network including the power grid 102 and high voltage capacitors 104.

When the integrated circuit system 100 supports a low voltage signaling scheme, the low voltage control 110 is configured to turn on the pass gates 108. Combined with the high voltage capacitors 104, the low voltage decoupling capacitors 106 can supply near instantaneous power to maintain the power grid 102 from voltage drops. More decoupling capacitance in low voltage signaling scheme can provide more near instantaneous power to stabilize the power grid 102 in a shorter time enabling the low voltage signaling scheme to support higher operating frequencies, compared with the high voltage signaling scheme.

The high voltage capacitors 104 and low voltage decoupling capacitors 106 can have a plurality of sizes and locations in accordance with available spaces and locations on the die of the integrated circuit system 100.

For example, the integrated circuit system 100 supports a high voltage signaling scheme DDR2 SDRAM, and a low voltage signaling scheme DDR4 SDRAM interfaces. The high voltage capacitors 104 are designed for the signaling scheme of the DDR2 SDRAM interface, which operates at the high voltages of 1.8V and low frequency of 800 MHz. The low voltage decoupling capacitors 106 are designed for the signaling scheme of the DDR4 SDRAM interface, which is operated at a lower voltage of 1.2 V and a higher frequency of 2 GHz compared.

When the general purpose I/O pads need to support the signaling scheme of DDR2 SDRAM interface, the low voltage control 110 can be configured to turn off the pass gates 108 to shield the low decoupling capacitors 106 from the high voltage power grid 102. The high voltage capacitors 104 can supply instant power to stabilize the power grid 102. The integrated circuit system 100 can deactivate the low voltage decoupling capacitors 106 dynamically for the high voltage signaling schemes. The power stored in the low decoupling capacitors 106 is not discharged when the pass gates 108 are turned off.

When the general purpose I/O pads need to support the signaling scheme of DDR4 SDRAM interface, low voltage decoupling capacitors 106 can be added. The integrated circuit system 100 can activate the low voltage decoupling capacitors 106 dynamically for the low voltage signaling schemes. The low voltage control signal 110 can be configured to turn on the pass gates 108 in low voltage signaling scheme. The power stored in the low decoupling capacitors 106 is discharged when the pass gates 108 are turned on to stabilize the power grid 102. In the meantime, the high voltage capacitors 104 can be combined with low voltage capacitors 106 and utilized in the low voltage signaling schemes.

It has been discovered that utilizing large decoupling capacitance at a lower voltage can reduce simultaneous switching noise (SSN) and improve capacitance density.

Figure 2:
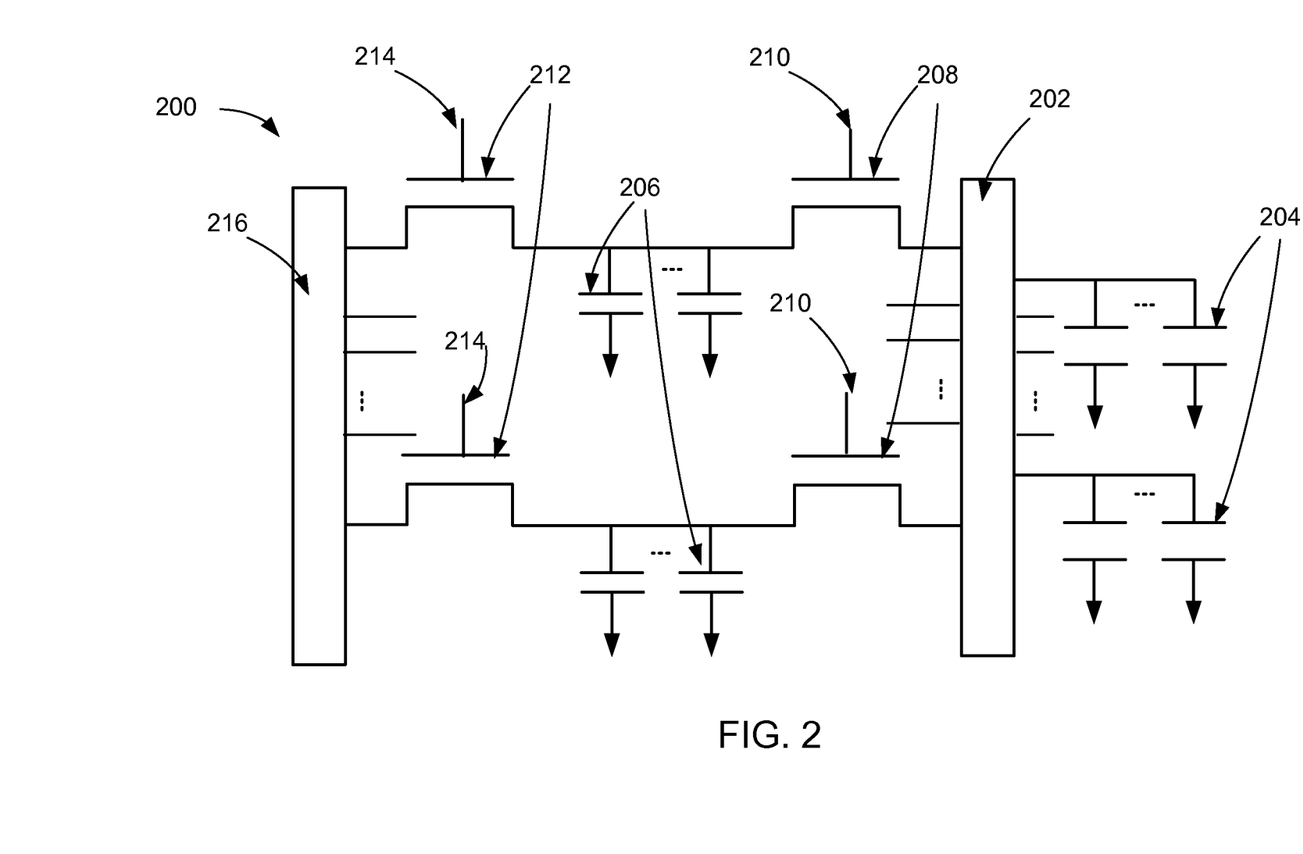
FIG. 2 is a schematic of low voltage decoupling capacitors of an integrated circuit system in a second embodiment of the present invention.

Referring now to FIG. 2, therein is shown a schematic of low voltage decoupling capacitors of an integrated circuit system 200 in a second embodiment of the present invention. The integrated circuit system 200 can include an input/output (I/O) supply grid, such as power grid 202, high voltage capacitors 204, low voltage decoupling capacitors 206 which are mounted on a die of the integrated circuit system 200, input/output (I/O) pass gates 208, input/output (I/O) control 210, logic pass gates 212, a logic control 214, and a logic power grid 216.

A plurality of the high voltage capacitors 204 are shunted and connected to the power grid 202. The gates of the I/O pass gates 208 are connected together to the I/O control 210. The sources of the I/O pass gates 208 are connected to the power grid 202. A plurality of the low voltage decoupling capacitors 206 are shunted and connected to the drains of the I/O pass gates 208 and the drains of the logic pass gates 212. The gates of the logic pass gates 212 are connected together to the logic control 214. The sources of the logic pass gates 212 are connected to the logic power grid 216.

The I/O power grid 202 can support multiple signaling schemes at multiple voltages in a power distribution network of the integrated circuit system 200. The high voltage capacitors 204 are designed to meet the highest voltage decoupling requirement. The low voltage decoupling capacitors 206 are designed to meet the low voltage decoupling requirement.

When the integrated circuit system 200 supports the signaling scheme at the highest voltage, the high voltage capacitors 204 are utilized to provide additional power supply for the I/O power grid 202. The I/O control 210 can be configured to turn off the I/O pass gates 208 to shield the low voltage decoupling capacitors 206 from the high voltage power distribution network including the I/O power grid 202 and high voltage capacitors 204. The logic control 214 can be configured to turn on the logic pass gates 212 when the low voltage decoupling capacitors 206 are not utilized for decoupling with the high voltage signaling scheme to add more capacitance to other low power rails, such as the logic power grid 216. Typically, the voltage of the logic power grid 216 can be lower than the voltage of the low voltage signaling scheme. For example, when the low voltage signaling scheme supports the DDR4 SDRAM interface at 1.2 V, the logic power grid 216 can be at a lower voltage of 0.9 V to avoid break down of the low voltage decoupling capacitors 206.

The I/O control 210 can be exclusive to the logic control 214. The I/O pass gates 208 and logic pass gates 214 cannot be turned on simultaneously.

When the integrated circuit system 200 supports the low voltage signaling scheme, the I/O control 210 is configured to turn on the I/O pass gates 208. The low voltage decoupling capacitors 206 combined with the high voltage capacitors 204, can supply additional power to maintain the voltage level of the I/O power grid 202. The logic control 214 is configured to turn off the logic pass gates 212 to shield the logic grid 216 from the higher voltage PDN.

The high voltage capacitors 204 and low voltage decoupling capacitors 206 can have a plurality of sizes and locations accordance with available spaces and locations on the die of the integrated circuit system 200.

It has been discovered that utilizing large decoupling capacitance at a lower voltage can reduce simultaneous switching noise (SSN) and improve capacitance density. By connecting low voltage decoupling capacitors 206 to other low power rails, additional reliability issues caused by floating metals of the low voltage decoupling capacitors 206 can be solved.

Figure 3:
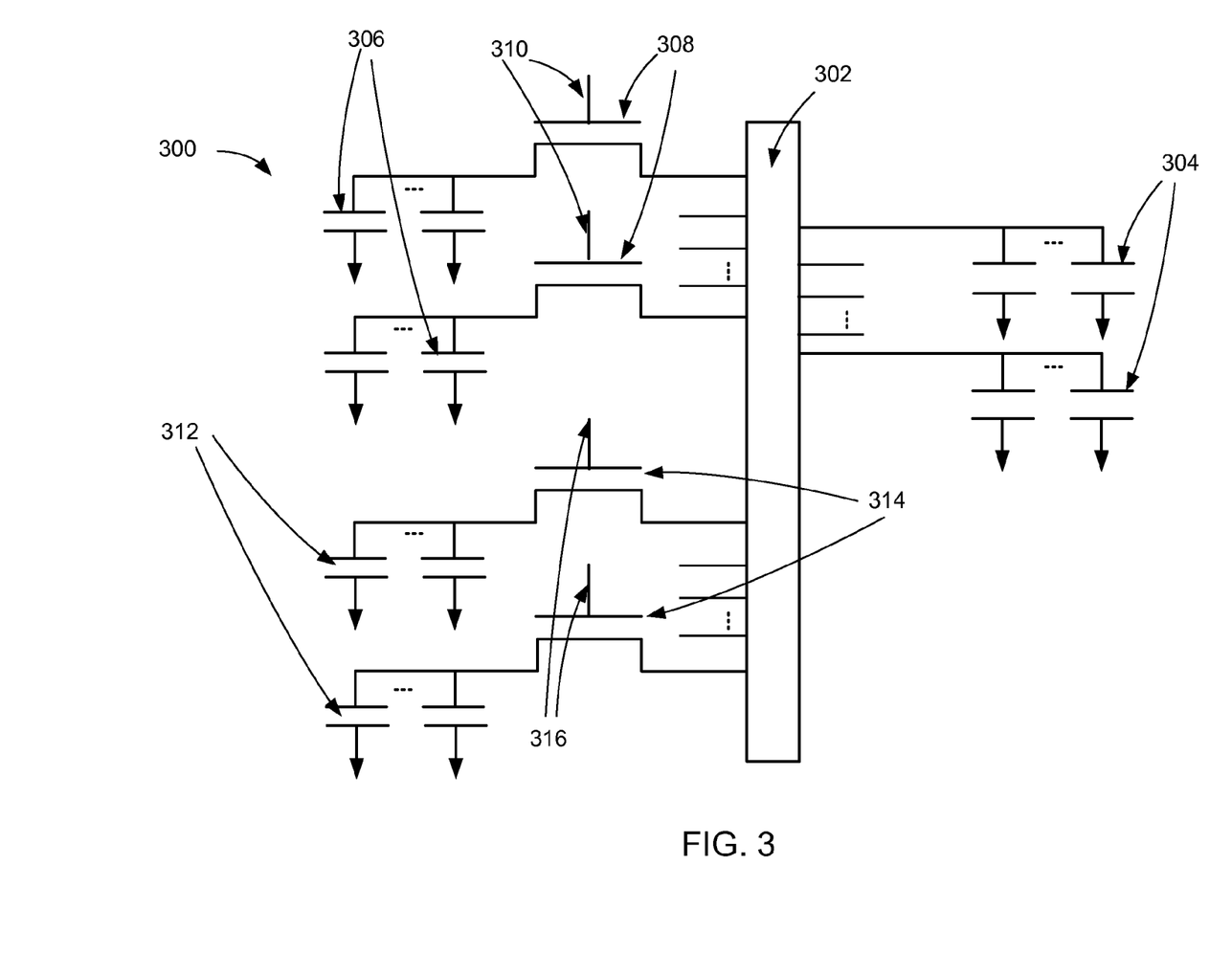
FIG. 3 is a schematic of low voltages decoupling capacitors of an integrated circuit system in a third embodiment of the present invention.

Referring now to FIG. 3, therein is shown a schematic of low voltages decoupling capacitors of an integrated circuit system 300 in a third embodiment of the present invention. The integrated circuit system 300 can include a power grid 302, high voltage capacitors 304, first low voltage decoupling capacitors 306 which is mounted on a die of the integrated circuit system 300, first pass gates 308, first low voltage control 310, second low voltage decoupling capacitors 312 which is mounted on a die of the integrated circuit system 300, second pass gates 314, and a second low voltage control 316.

A plurality of the high voltage capacitors 304 are shunted and connected to the power grid 302. The gates of the first pass gates 308 are connected together to the first low voltage control 310. The sources of the first pass gates 308 are connected to the power grids 302. A plurality of the first low voltage decoupling capacitors 306 are shunted and connected between the drains of the first pass gates 308 and grounds. The gates of the second pass gates 314 are connected together to the second low voltage control 316. The sources of the second pass gates 314 are connected to the power grid 302. A plurality of the second low voltage decoupling capacitors 312 are shunted and connected between the drains of the second pass gates 314 and the grounds.

The power grid 302 can support multiple signaling schemes at multiple voltages in a power distribution network of the integrated circuit system 300. The high voltage capacitors 304 are designed to meet the highest voltage requirement. The first low voltage capacitors 306 are designed to meet the first low voltage decoupling requirement. The second low voltage capacitors 312 are designed to meet the second low voltage decoupling requirement, wherein the second low voltage is lower than the first low voltage.

When the integrated circuit system 300 supports the high voltage signaling scheme, the high voltage capacitors 304 are utilized to provide additional power supply to the power grid 302. The first low voltage control 310 and the second low voltage control 316 can be configured to turn off the first pass gates 308 and second pass gates 314 respectively. The first low voltage capacitors 306 and the second low voltage decoupling capacitors 312 are shielded from the high voltage power distribution network including the power grid 302 and high voltage capacitors 304.

When the integrated circuit system 300 supports a first low voltage signaling scheme and a first low voltage is higher than a second low voltage, the first low voltage control 310 is configured to turn on the first pass gates 308 while the second low voltage control 316 is configured to turn off the second pass gates 314. The first low voltage decoupling capacitors 306 combined with the high voltage capacitors 304 can supply additional power to maintain the voltage level of the power grid 302. The second low voltage decoupling capacitors 312 can be shielded from the higher voltage PDNs.

When the integrated circuit system 300 supports the second low voltage signaling scheme, the first low voltage control 310 and second low voltage control 316 can be configured to turn on the first pass gates 308 and the second pass gates 314 respectively. The first low voltage decoupling capacitors 306 and the second low voltage decoupling capacitors 312 combined with the high voltage capacitors 304 can supply near instantaneous power to maintain the voltage of the power grid 302.

The high voltage capacitors 304, the first low voltage decoupling capacitors 306 and the second low voltage decoupling capacitors 312 can have a plurality of sizes and locations in accordance with the available spaces and locations on the die of the integrated circuit system 300.

For example, the integrated circuit system 300 supports a high voltage signaling scheme DDR2 SDRAM, a first low voltage signaling scheme DDR3 SDRAM interface, and a second low voltage signaling scheme DDR4 SDRAM interfaces. The high voltage capacitors 304 designed for the signaling scheme of DDR2 SDRAM interface are used for decoupling, which operates at the high voltages of 1.8 V and low frequency of approximately 800 MHz.

The first low voltage control 310 can be configured to turn off the first pass gates 308 gating the first low voltage decoupling capacitors 306 to shield the first low decoupling capacitors 306 from the high voltage power grid 302. The integrated circuit system 300 can deactivate the first low voltage decoupling capacitors 306 dynamically for the high voltage signaling schemes. The power stored in the first low decoupling capacitors 306 is not discharged when the first pass gates 308 are turned off.

The second low voltage control 316 can be configured to turn off the second pass gates 314 gating the second low voltage decoupling capacitors 312 to shield the second low decoupling capacitors 312 from the high voltage power grid 302. The integrated circuit system 300 can deactivate the second low voltage decoupling capacitors 312 dynamically for the high voltage signaling schemes. The power stored in the second low decoupling capacitors 312 is not discharged when the second pass gates 314 are turned off.

When the general purpose I/O pads supports the signaling scheme of DDR3 SDRAM interface, which operates at the first low voltage of 1.5 V and a higher frequency of 1.6 GHz, the first low voltage decoupling capacitors 306 can be added. The integrated circuit system 300 can activate the first low voltage decoupling capacitors 306 dynamically for the first low voltage signaling schemes. The first low voltage control signal 310 can be configured to turn on the first pass gates 308 in first low voltage signaling scheme. The power stored in the first low decoupling capacitors 306 is discharged when the first pass gates 308 are turned on to stabilize the power grid 302. In the meanwhile, the high voltage capacitors 304 can be combined with the first low voltage capacitors 306 and utilized in the first low voltage signaling schemes.

The second low voltage signaling scheme supports the DDR4 SDRAM interface operating at the second low voltage of 1.2 V, which is lower than the first low voltage DDR3 SDRAM of 1.5 V. The second low voltage control signal 316 can be configured to turn off the second pass gates 314 to shield the second low voltage capacitors 312 from the first low voltage.

When the general purpose I/O pads supports the signaling scheme of a DDR4 SDRAM interface, which operates at the second lower voltage of 1.2 V and a higher frequency of 2 GHz, the second low voltage decoupling capacitors 312 can be added. The integrated circuit system 300 can activate the second low voltage decoupling capacitors 312 dynamically for the second low voltage signaling schemes. The second low voltage control signal 316 can be configured to turn on the pass gates 314 in the second low voltage signaling scheme. The power stored in the second low decoupling capacitors 312 is discharged when the second pass gates 314 are turned on to stabilize the power grid 302. In the meanwhile, the high voltage capacitors 304, the first low voltage decoupling capacitors 306 can be combined with the second low voltage capacitors 312 and utilized in the second low voltage signaling scheme.

It has been discovered that utilizing large decoupling capacitance at a lower voltage can reduce simultaneous switching noise (SSN) and improve capacitance density. Multiple groups of low voltage decoupling capacitors can be utilized accordance with different low voltages dynamically to add flexibility.

Figure 4:
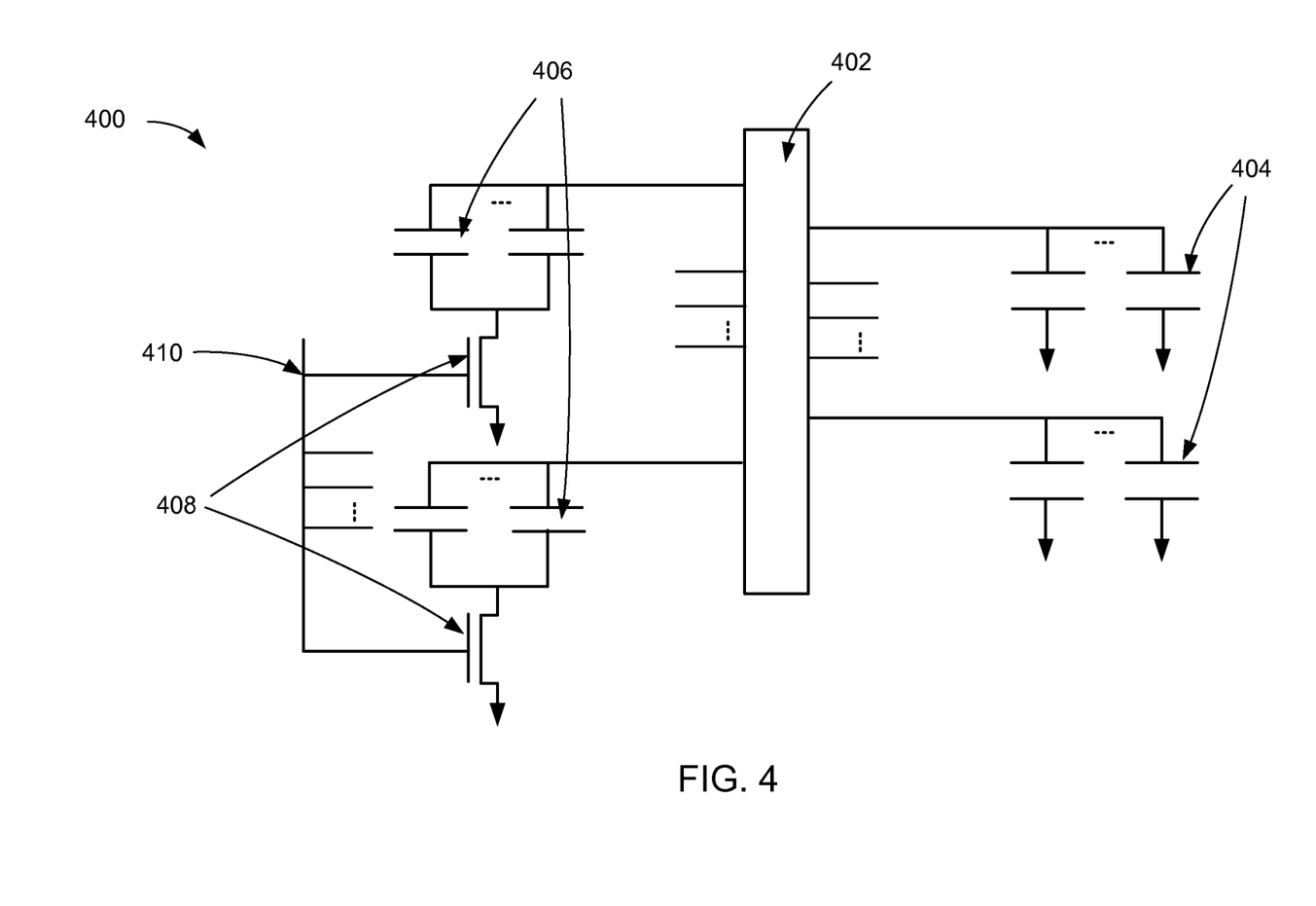
FIG. 4 is a schematic of low voltage decoupling capacitors of an integrated circuit system in a fourth embodiment of the present invention.

Referring now to FIG. 4, therein is shown a schematic of low voltage decoupling capacitors of an integrated circuit system 400 in a fourth embodiment of the present invention. The integrated circuit system 400 can include a power grid 402, high voltage capacitors 404, low voltage decoupling capacitors 406 which is mounted on a die of the integrated circuit system 400, pass gates 408, and a low voltage control 410.

A plurality of the high voltage capacitors 404 are shunted and connected to the power grid 402. The gates of the pass gates 408 are connected together to the low voltage control 410. The sources of the pass gates 408 are connected to grounds. A plurality of the low voltage decoupling capacitors 406 are shunted and connected between the drains of the pass gates 408 and the power grid 402.

The power grid 402 can support multiple voltages in a power distribution network of the integrated circuit system 400. The high voltage capacitors 404 are designed to meet the highest voltage requirement. The low voltage capacitors 406 are designed to meet the low voltage decoupling requirement.

When the integrated circuit system 400 supports a high voltage signaling scheme, the high voltage capacitors 404 are utilized to provide additional power supply for the power grid 402. The low voltage control 410 is configured to turn off the pass gates 408 to shield the low voltage decoupling capacitors 406 from the power grid 402.

When the integrated circuit system 400 supports a low voltage signaling scheme, the low voltage control 410 is configured to turn on the pass gates 408. The low voltage decoupling capacitors 406 combined with the high voltage capacitors 404, can be discharged and supply additional power to maintain the voltage level of the power grid 402.

The high voltage capacitors 404 and low voltage decoupling capacitors 406 can have a plurality of sizes and locations accordance with available spaces and locations on the die of the integrated circuit system 400.

It has been discovered that utilizing large decoupling capacitors at a lower voltage can reduce simultaneous switching noise (SSN) and improve capacitance density. By gating the low voltage decoupling capacitors to ground, can reduce via contacts of the decoupling capacitors.

Figure 5:
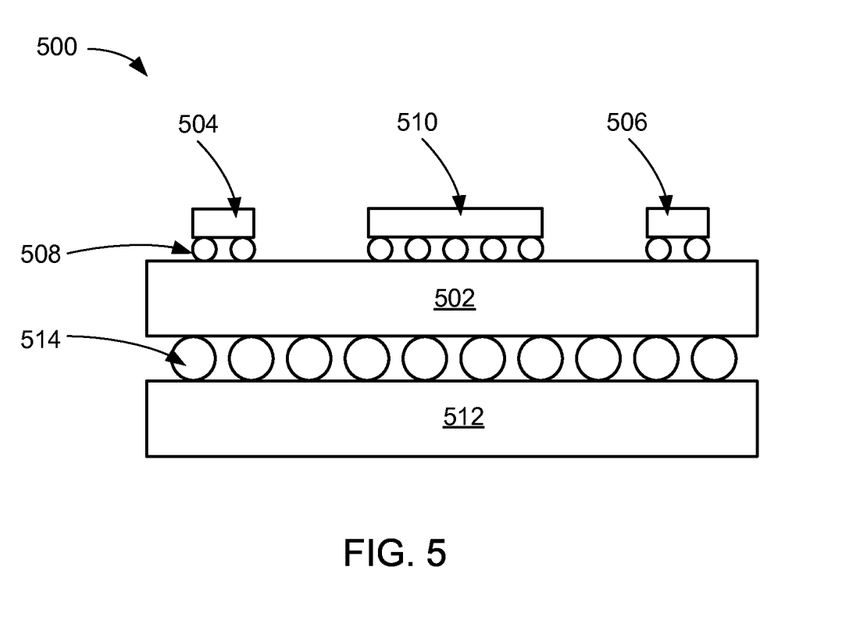
FIG. 5 is a cross-sectional view of low voltage decoupling capacitors of an integrated circuit system in a fifth embodiment of the present invention.

Referring now to FIG. 5, therein is shown a cross-sectional view of low voltage decoupling capacitors of an integrated circuit system 500 in a fifth embodiment of the present invention. The integrated circuit system 500 can include an interposer 502, on-interposer high voltage capacitors 504 and on-interposer low voltage decoupling capacitors 506 which are mounted on the interposer 502, conductive connectors 508, a device 510 with supply grids and pass gates, a package substrate 512, and external connectors 514.

The on-interposer high voltage capacitors 504, the device 510, and on-interposer low voltage decoupling capacitors 506 are mounted on the interposer 502 by conductive connectors 508, such as solder balls. The interposer 502 is mounted on the package substrate 512 and connected by external connectors 514. Similar to the on-die decoupling capacitors, the on-interposer high voltage capacitors 504 and on-interposer low voltage decoupling capacitors 506 are connected to the supply grids and pass gates of the device 510. The supply grids of the device 510 can include power grids and ground grids. The on-interposer low power decoupling capacitors 506 and the on-interposer high voltage capacitors 504 can operate in a similar fashion as the on-die decoupling capacitors explained in the above embodiments.

It has been discovered that having decoupling capacitors mounted on an interposer, a substrate package, or different dies in two dimensional (2D) or three dimensional (3D) integration in embodiments of the present invention makes available the possibility of providing larger amounts of capacitance at a lower cost. The 2D integration can integrate multiple dies on a single level. The 3D integration can integrate multiple dies on two or more levels, wherein the multiple dies can be connected vertically and horizontally.

Mounting the decoupling capacitors on the package substrate, interposer, or different dies produces a relatively low inductive electrical path between the decoupling capacitors and the device, compared to mounting on a printed circuit board (PCB) where the package substrate is mounted on.

Figure 6:
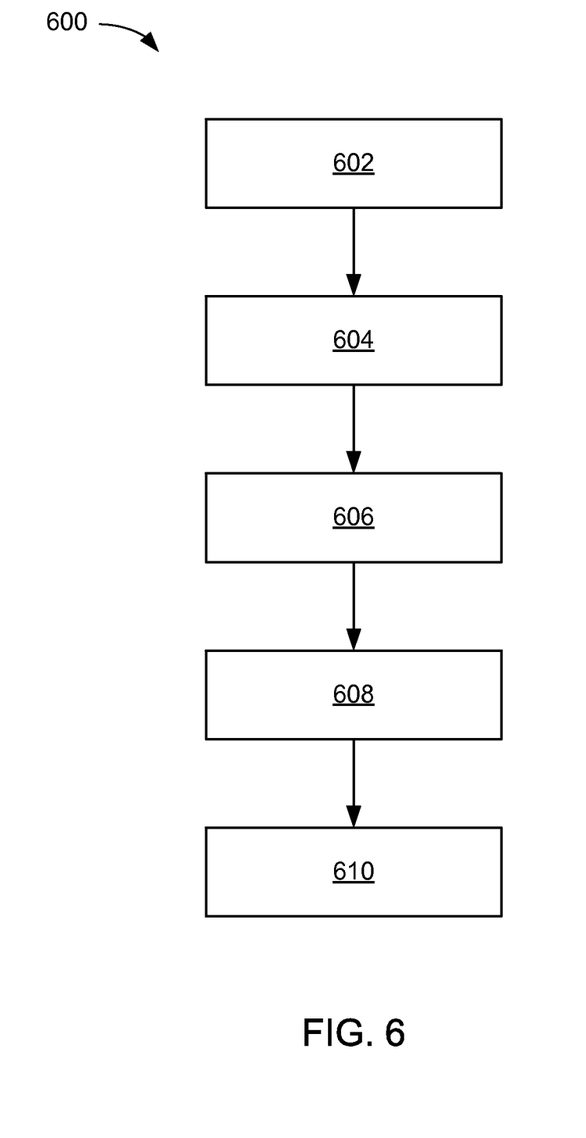
FIG. 6 is a flow chart of a method of manufacture of an integrated circuit system in a further embodiment of the present invention.

Referring now to FIG. 6, therein is shown a flow chart of a method 600 of manufacture of an integrated circuit system in a further embodiment of the present invention. The method 600 includes: providing a supply grid connected to an active component of an integrated circuit die in a block 602; connecting a high voltage capacitor to the supply grid in a block 604; connecting a low voltage decoupling capacitor to the supply grid in a block 606; gating the low voltage decoupling capacitor with a pass gate in a block 608; and configuring a pass gate control for controlling the pass gate to cause the high voltage capacitor and the low voltage decoupling capacitor to stabilize voltage of the supply grid during activity of the active component in a block 610.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing an integrated circuit systems/fully compatible with conventional manufacturing methods or processes and technologies.

Another important aspect of embodiments of the present invention is that it valuably supports and services the historical trend of reducing costs, simplifying systems, and increasing performance.

These and other valuable aspects of embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a supply grid connected to an active component of an integrated circuit die;
   connecting a high voltage capacitor to the supply grid;
   connecting a low voltage decoupling capacitor to the supply grid;
   gating the low voltage decoupling capacitor with a pass gate; and
   configuring a pass gate control for controlling the pass gate to cause the high voltage capacitor and the low voltage decoupling capacitor to stabilize voltage of the supply grid during activity of the active component.

2. The method as claimed in claim 1 further comprising:
   providing a logic supply grid;
   connecting a logic pass gate between the logic supply grid and the low voltage decoupling capacitor; and
   configuring a logic control controlling the logic pass gate, wherein the logic control is configured to turn off the logic pass gate dynamically in accordance with a signaling scheme.

3. The method as claimed in claim 1 further comprising:
   connecting a second low voltage decoupling capacitor to the supply grid;
   gating the second low voltage decoupling capacitor with a second pass gate; and
   configuring a second low voltage control controlling the second pass gate, wherein the second low voltage control is configured to turn on the second pass gate dynamically in accordance with a signaling scheme.

4. The method as claimed in claim 1 further comprising:
   connecting the pass gate between the low voltage decoupling capacitor and a ground grid.

5. The method as claimed in claim 1 wherein connecting the low voltage decoupling capacitor includes connecting the low voltage decoupling capacitor on a die, an interposer of the integrated circuit system, or a combination thereof.

6. A method of manufacture of an integrated circuit system comprising:
   providing a power grid supporting a plurality of signaling schemes;
   connecting a high voltage capacitor to the power grid;
   connecting a low voltage decoupling capacitor to the power grid, wherein connecting the low voltage decoupling capacitor includes connecting the low voltage decoupling capacitor on a die, an interposer of the integrated circuit system, or a combination thereof;
   gating the low voltage decoupling capacitor with a pass gate; and
   configuring a low voltage control controlling the pass gate, wherein the low voltage control is configured to turn on the pass gate dynamically in a low voltage signaling scheme, and turn off the pass gate dynamically in a high voltage signaling scheme to stabilize the voltage of the power grid.

7. The method as claimed in claim 6 further comprising:
   providing a logic power grid, wherein a voltage of the logic power grid is lower than the power grid;
   connecting a logic pass gate between the logic power grid and the low voltage decoupling capacitor; and
   configuring a logic control controlling the logic pass gate, wherein the logic control is configured dynamically to turn off the logic pass gate in low voltage signaling schemes, and turn on the logic pass gate when the pass gate are turned off.

8. The method as claimed in claim 6 further comprising:
   connecting a second low voltage decoupling capacitor to the power grid;
   gating the second low voltage decoupling capacitor with a second pass gate; and
   configuring a second low voltage control controlling the second pass gate, wherein the second low voltage control is configured to turn on the second pass gate dynamically in a second low voltage signaling scheme, and turn off the second pass gate in signaling schemes supporting higher voltages than the second low voltage signaling scheme.

9. The method as claimed in claim 6 further comprising:
connecting the pass gate between the low voltage decoupling capacitor and a ground grid.

10. The method as claimed in claim 6 further comprising:
driving the pass gate control by a memory bit line.

11. A system of an integrated circuit comprising:
a supply grid connected to an active component of an integrated circuit die;
a high voltage capacitor connected to the supply grid;
a low voltage decoupling capacitor connected to the supply grid;
a pass gate gating the low voltage decoupling capacitor; and
a pass gate control for controlling the pass gate to cause the high voltage capacitor and the low voltage decoupling capacitor to stabilize voltage of the supply grid during activity of the active component.

12. The system as claimed in claim 11 further comprising:
a logic supply grid;
a logic pass gate connected between the logic supply grid and the low voltage decoupling capacitor; and
a logic control for controlling the logic pass gate, wherein the logic control is configured to turn off the logic pass gate dynamically in accordance with a signaling scheme.

13. The system as claimed in claim 11 further comprising:
a second low voltage decoupling capacitor connected to the supply grid;
a second pass gate gating the second low voltage decoupling capacitor; and
a second low voltage control controlling the second pass gate, wherein the second low voltage control is configured to turn on the second pass gate dynamically in accordance with a signaling scheme.

14. The system as claimed in claim 11 further comprising:
the pass gate connected between the low voltage decoupling capacitor and a ground grid.

15. The system as claimed in claim 11 wherein the low voltage decoupling capacitor can be connected on a die, an interposer of the integrated circuit system, or a combination thereof.

16. The system as claimed in claim 11 further comprising:
a power grid supporting a plurality of signaling schemes;
the high voltage capacitor connected to the power grid;
the low voltage decoupling capacitor connected to the power grid, wherein the low voltage decoupling capacitor includes the low voltage decoupling capacitor on a die, an interposer of the integrated circuit system, or a combination thereof; and
a low voltage control for controlling the pass gate, wherein the low voltage control is configured to turn on the pass gate dynamically in a low voltage signaling scheme, and turn off the pass gate dynamically in a high voltage signaling scheme.

17. The system as claimed in claim 16 further comprising:
a logic power grid, wherein a voltage of the logic power grid is lower than the power grid;
a logic pass gate connected between the logic power grid and the low voltage decoupling capacitor; and
a logic control for controlling the logic pass gate, wherein the logic control is configured dynamically to turn off the logic pass gate in low voltage signaling schemes, and turn on the logic pass gate when the pass gate are turned off.

18. The system as claimed in claim 16 further comprising:
a second low voltage decoupling capacitor connected to the power grid;
a second pass gate gating the second low voltage decoupling capacitor; and
a second low voltage control for controlling the second pass gate, wherein the second low voltage control is configured dynamically to turn on the second pass gate in a second low voltage signaling scheme, and turn off the second pass gate in signaling schemes supporting higher voltages than a second low voltage.

19. The system as claimed in claim 16 further comprising:
the pass gate connected between the low voltage decoupling capacitor and a ground grid.

20. The system as claimed in claim 16 further comprising:
the pass gate control driven by a memory bit line.

* * * * *